(12) United States Patent
Tang

(10) Patent No.: US 10,879,880 B2
(45) Date of Patent: Dec. 29, 2020

(54) OSCILLATOR

(71) Applicant: Wuhan Xinxin Semiconductor Manufacturing Co., Ltd., Hubei (CN)

(72) Inventor: Yuan Tang, San Jose, CA (US)

(73) Assignee: WUHAN XINXIN SEMICONDUCTOR MANUFACTURING CO., LTD., Hubei (CN)

( * ) Notice: Subject to any disclaimer, the term of this patent is extended or adjusted under 35 U.S.C. 154(b) by 29 days.

(21) Appl. No.: 16/210,904

(22) Filed: Dec. 5, 2018

(65) Prior Publication Data

US 2019/0238121 A1 Aug. 1, 2019

(30) Foreign Application Priority Data

Jan. 26, 2018 (CN) .......................... 2018 1 0079257

(51) Int. Cl.
*H03K 3/03* (2006.01)
*H03K 3/354* (2006.01)
*H02M 3/06* (2006.01)
*H03K 3/023* (2006.01)
*H03K 9/08* (2006.01)

(52) U.S. Cl.
CPC ................ *H03K 3/03* (2013.01); *H02M 3/06* (2013.01); *H03K 3/023* (2013.01); *H03K 3/0315* (2013.01); *H03K 3/354* (2013.01); *H03K 9/08* (2013.01)

(58) Field of Classification Search
CPC ....... G01R 31/31725; H03L 1/00; H03L 7/07; H03K 3/023; H03K 3/03; H03K 3/0315; H03K 9/08; H03K 9/017

USPC .......... 331/57, 2, 111, 45, 11; 327/172, 175
See application file for complete search history.

(56) References Cited

U.S. PATENT DOCUMENTS 6,362,697 B1  3/2002 Pulvirenti
9,035,706 B2 * 5/2015 Chen .................. G01R 31/2882
                                                    331/55

FOREIGN PATENT DOCUMENTS

| CN | 101697483 A | 4/2010 |
| CN | 103546123 A | 1/2014 |
| CN | 105071786 A | 11/2015 |
| CN | 107040210 A | 8/2017 |

* cited by examiner

*Primary Examiner* — Arnold M Kinkead
(74) *Attorney, Agent, or Firm* — Muncy, Geissler, Olds & Lowe, P.C.

(57) ABSTRACT

An oscillator including two sequentially connected pulse generation circuits is disclosed. Each pulse generation circuit includes a charge/discharge circuit and a switch circuit and outputs a first or second signal depending on an input signal. The switch circuit controls the charge/discharge circuit so that the latter is charged when the input signal is at a first level and discharged when the input signal is at a second level higher than the first level. When the input signal is at the first level, the first signal is at the first level and the second signal is at the second level. When the input signal is at the second level, the first signal is at the second level and the second signal is at the first level. Upon completion of discharge of the charge/discharge circuit, the first signal changes to the first level and the second signal changes to the second level.

14 Claims, 3 Drawing Sheets

OSCILLATOR

CROSS-REFERENCE TO RELATED APPLICATION

This application claims the priority of Chinese patent application number 201810079257.9, filed on Jan. 26, 2018, the entire contents of which are incorporated herein by reference.

TECHNICAL FIELD

The present invention relates to the field of oscillators and, in particular, to an oscillator.

BACKGROUND

A ring oscillator is a device composed of three or a greater odd number of Inverters that are interconnected in an input-to-output end-to-end manner. Despite a range of advantages including simple circuit, ease of starting oscillation and ease of being integrated, such oscillators suffer from a lack of flexibility due to the absence of a delay network frequency. Moreover, a low-frequency oscillation would be difficult because it requires a greater number of Inverters. Furthermore, as inverters are usually accompanied with certain errors in their delays, the frequency of such oscillators would be inaccurate.

A voltage controlled oscillator (VCO) is an oscillation circuit whose output frequency is in correspondence with an input control voltage. A VCO can be widely defined as any oscillator whose frequency is a function of its input signal voltage and whose operation or parameters of components in the oscillation circuit is subjected to the control of the input control voltage. VCOs offer a wide variety of advantages essentially including a good frequency stability, a high control sensitivity, a wide frequency modulation range, a linear relationship between frequency offset and control voltage, and ease of being integrated. However, a duty cycle of a VCO cannot be adjusted easily and the VCO sometimes cannot be switched to complete ON/OFF states. Moreover, ring oscillators and VCOs are not suitable for energy-efficient circuits because they must be driven by high currents. Further, VCOs cannot produce rail-to-rail output voltages, that is, a high level of the output voltage cannot reach a positive value of a power supply voltage and a low level of the output voltage cannot reach a negative value of the power supply voltage.

SUMMARY OF THE INVENTION

It is an object of the present invention to provide an oscillator immune from the low oscillation frequency and duty cycle adjustability problem of the conventional oscillators.

To this end, the present invention provides an oscillator comprising two pulse generation circuits that are connected in a sequence with an output of a second one of the pulse generation circuits coupled to an input of a first one of the pulse generation circuits.

Each of the pulse generation circuits outputs a first signal or a second signal depending on an input signal.

Each of the pulse generation circuits comprises a charge/discharge circuit and a switch circuit. The switch circuit is configured to control the charge/discharge circuit to be charged when the input signal is at a first level and control the charge/discharge circuit to be discharged when the input signal is at a second level. The first level is lower than the second level.

When the input signal is at the first level, the first signal is at the first level and the second signal is at the second level When the input signal is at the second level, the first signal is at the second level and the second signal is at the first level. After completing the discharge of the charge/discharge circuit, the first signal changes to the first level and the second signal changes to the second level.

Optionally, in the oscillator, the switch circuit may comprise a first transistor and a second transistor, each of the first and second transistors has a gate supplied with the input signal, the first transistor having a source connected to a power supply, the first transistor having a drain connected to the charge/discharge circuit, the second transistor having a drain connected to the drain of the first transistor, the second transistor having a source connected to the charge/discharge circuit.

Optionally, in the oscillator, the first transistor may be a P-channel field effect transistor, wherein the second transistor is an N-channel field effect transistor.

Optionally, in the oscillator, each of the pulse generation circuits may further comprise a NAND gate with two inputs of the NAND gate connected respectively to the input signal and the drain of the first transistor.

Optionally, in the oscillator, the NAND gate may comprise a third transistor, a fourth transistor, a fifth transistor and a sixth transistor, wherein:

gates of the third and fourth transistors are both connected to the input signal and gates of the fifth and sixth transistors are both connected to the drain of the first transistor, the third and fifth transistors are both P-channel field effect transistors and the fourth and sixth transistors are both N-channel field effect transistors, sources of the third and fifth transistors are both connected to the power supply and drains of the third and fifth transistors are both connected to an output of the NAND gate;

a drain of the fourth transistor is connected to the drain of the third transistor, a source of the fourth transistor is connected to a drain of the sixth transistor, and a source of the sixth transistor is grounded; and channel aspect ratios of the third and fifth transistors are smaller than channel aspect ratios of the fourth and sixth transistors.

Optionally, the oscillator may further comprise a seventh transistor and an eighth transistor, wherein:

the seventh and eighth transistors are both N-channel field effect transistors;

the seventh transistor has a gate connected to the output of the NAND gate, a drain connected to the drain of the first transistor and a source connected to a drain of the eighth transistor; and the eighth transistor has a gate connected to the input signal and a source that is grounded.

Optionally, in the oscillator, each of the pulse generation circuits may further comprise a first inverter and a second inverter, the first inverter having an input connected to an output of the NAND gate, the first inverter outputting the first signal, the second inverter having an input connected to an output of the first inverter, the second inverter outputting the second signal.

Optionally, in the oscillator, the two pulse generation circuits comprises a first pulse generation circuit and a second pulse generation circuit, a second signal of the first pulse generation circuit may be provided as the input signal to the second pulse generation circuit.

Optionally, the oscillator may further comprise an enable signal input circuit configured to, wherein when an enable signal is provided to the enable signal input circuit, the enable signal input circuit provides an initial signal to the first pulse generation circuit.

Optionally, in the oscillator, the enable signal input circuit may comprise a NOR gate and a third inverter, wherein the enable signal is supplied to an input of the third inverter, wherein the NOR gate has two inputs connected respectively to an output of the third inverter and the output of the first inverter of the second pulse generation circuit, and wherein an output of the NOR gate is connected to the first pulse generation circuit and thereby provides the input signal for the first pulse generation circuit to the first pulse generation circuit.

Optionally, in the oscillator, the charge/discharge circuit may comprise a first resistor and a first capacitor, wherein the first resistor is grounded at one end and connected to the source of the second transistor at the other end; and the first capacitor is grounded at one end and connected to the drain of the first transistor at the other end.

Optionally, the oscillator may have a duty cycle determined by changing the resistance of the first resistor and the capacitance of the first capacitor.

Optionally, in the oscillator, the charge/discharge circuit may comprise a ninth transistor, a tenth transistor and a first capacitor, wherein:

the ninth transistor has a gate connected to a first gate-controlled voltage, a drain connected to the source of the second transistor and a source that is grounded;

the tenth transistor has a gate connected to a second gate-controlled voltage, a drain connected to the source of the second transistor and a source that is grounded; and the first capacitor is grounded at one end and connected to the drain of the first transistor at the other end.

Optionally, the oscillator may have a duty cycle determined by changing the first gate-controlled voltage, wherein the second gate-controlled voltage maintains the tenth transistor on when the oscillator ceases oscillation.

In the oscillator provided in the present invention, each of the pulse generation circuits outputs a first signal or a second signal depending on an input signal. When the input signal first one of the pulse generation circuits is at a second level, the first signal is at the second level and the second signal is at a first level. After the discharge of the charge/discharge circuit is completed, the first signal changes to the first level, and the second signal changes to the second level. Thereby, the pulse generation circuit completes one oscillation cycle. With a proper connection between the two pulse generation circuits, the input signal of the first one of the pulse generation circuits may change back to the first level, causing the charge/discharge circuit to be charged again, i.e., start of another oscillation cycle. The charge and discharge of the charge/discharge circuit can delay the oscillation frequency. Based on charge and discharge times of the charge/discharge circuit, the oscillation frequency and duty cycle can be easily adjusted. Further, as the number of gate circuits in the oscillator is reduced, the oscillator can be driven by a significantly lower drive current.

In these figures: 10, a first pulse generation circuit; 20, a second pulse generation circuit; and 30, an enable signal input circuit.

DETAILED DESCRIPTION

The oscillator proposed in this invention will be described below in further detail with reference to the accompanying drawings and some specific embodiments. Features and advantages of the invention will be more apparent from the following detailed description, and from the appended claims. It is noted that the figures are provided in a very simplified form not necessarily presented to scale, with the only intention to facilitate convenience and clarity in explaining the disclosed embodiments.

The core concept of the present invention is to provide an oscillator immune from the low oscillation frequency and duty cycle adjustability problem of the conventional oscillators.

To this end, the invention provides an oscillator, comprising two pulse generation circuits that are connected in a sequence with an output of a second one of the pulse generation circuits coupled to an input of a first one of the pulse generation circuit. Each of the pulse generation circuits outputs a first signal or second signal depending on an input signal. Each of the pulse generation circuits comprises a charge/discharge circuit and a switch circuit. The switch circuit is configured to control the charge/discharge circuit to be charged when the input signal is at a first level and control the charge/discharge circuit to be discharged when the input signal is at a second level. The first level is lower than the second level. When the input signal is at the first level, the first signal is at the first level and the second signal is at the second level. When the input signal is at the second level, the first signal is at the second level and the second signal is at the first level. Upon completion of the discharge of the charge/discharge circuit, the first signal changes to the first level and the second signal changes to the second level.

Figure 3:
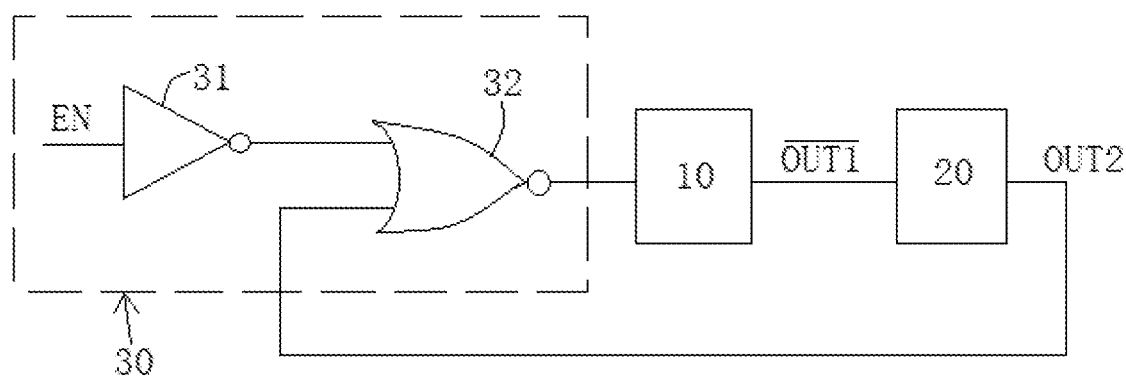
FIG. 3 is a structural schematic of an oscillator according to another embodiment of the present invention.

FIG. 3 shows an oscillator according to one embodiment of the present invention, which includes two pulse generation circuits that are connected in a sequence, with an output of the first one of the pulse generation circuits connected to an input of the second one of the pulse generation circuits, and an output of the second one of the pulse generation circuits coupled to an input of the first one of the pulse generation circuits (with the pulse generation circuits 10 and 20 as an example, an output of the pulse generation circuit 10 is connected to an input of the pulse generation circuit 20, and an output of the pulse generation circuit 20 is coupled to an input of the pulse generation circuit 10).

Figure 1:
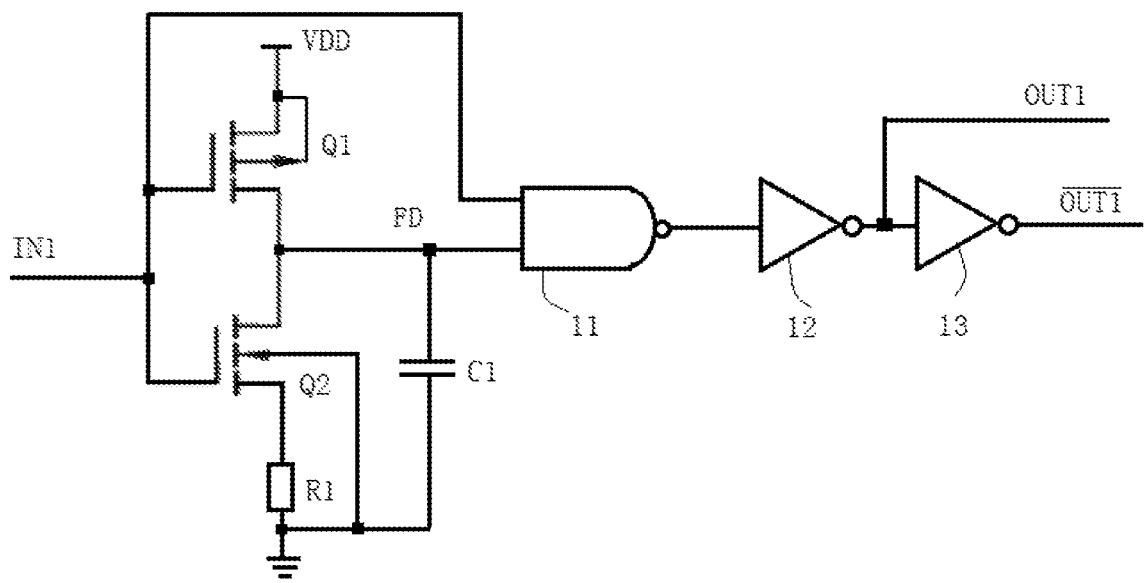
FIG. 1 is a schematic diagram showing a first pulse generation circuit in an oscillator according to an embodiment of the present invention.
Figure 2:
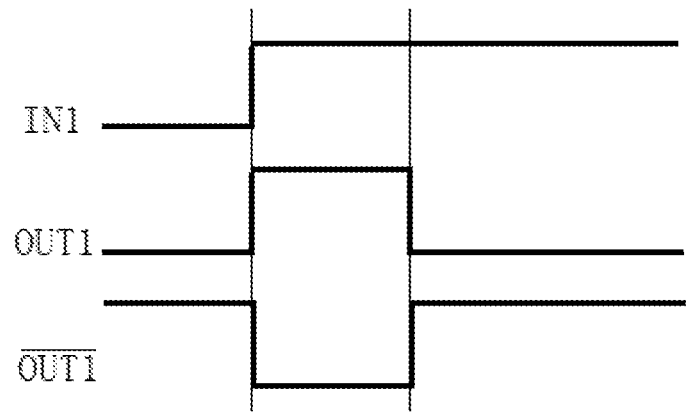
FIG. 2 schematically illustrates waveforms produced by a first pulse generation circuit in an oscillator according to an embodiment of the present invention.
Figure 5:
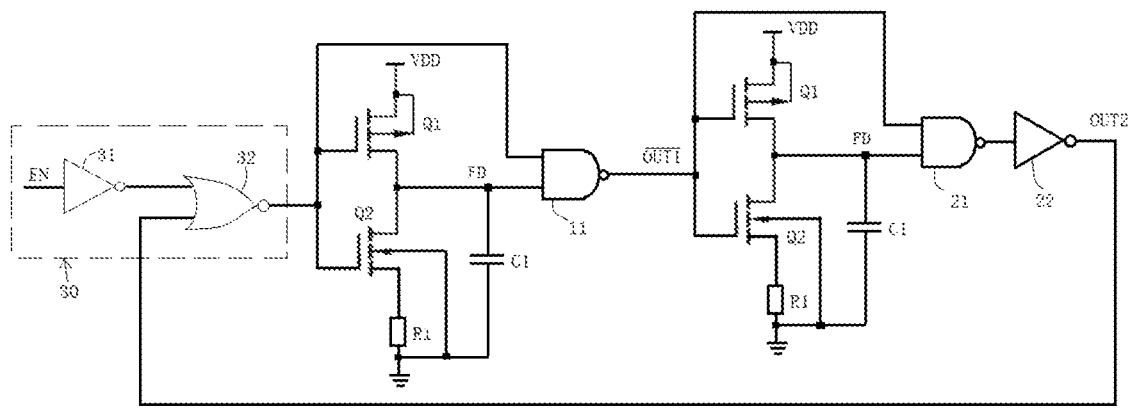
FIG. 5 shows a schematic circuit diagram of an oscillator according to a further embodiment of the present invention.

As shown in FIGS. 1 and 5 (with the pulse generation circuit 10 in FIG. 3 as an example), each of the pulse generation circuits outputs a first signal OUT1 (which is OUT2 in FIGS. 3 and 5 for the pulse generation circuit 20) or a second signal $\overline{OUT1}$ (which is $\overline{OUT2}$ in FIGS. 3 and 5 for the pulse generation circuit 20) depending on an input signal IN1. In other words, IN1 is provided to the input of the first pulse generation circuit 10. Each of the pulse generation circuits includes a charge/discharge circuit and a switch circuit. The switch circuit controls the charge/discharge circuit so that the latter is charged when the input signal IN1 is at a first level and discharged when the input signal IN1 is at a second level. The first level is lower than the second level. In these digital circuits, the first level represents the logic "0" and the second level represents the logic "1". As shown in FIG. 2, when the input signal IN1 is at the first level, the first signal OUT1 is at the first level and the second signal $\overline{OUT1}$ is at the second level. When the input signal IN1 is at the second level, the first signal OUT1 is at the second level and the second signal $\overline{OUT1}$ is at the first level. After completion of the discharge of the charge/discharge circuit, the first signal OUT1 changes to the first level and the second signal $\overline{OUT1}$ changes to the second level.

Specifically, in the oscillator, the switch circuit may include a first transistor Q1 and a second transistor Q2, each of which has a gate supplied with the input signal IN1. The first transistor Q1 has a source connected to a power supply VDD and a drain connected to the charge/discharge circuit. The second transistor Q2 has a drain connected to the drain of the first transistor Q1 and a source connected to the charge/discharge circuit. The first transistor Q1 may be a P-channel field effect transistor and the second transistor may be an N-channel field effect transistor.

Figure 6:
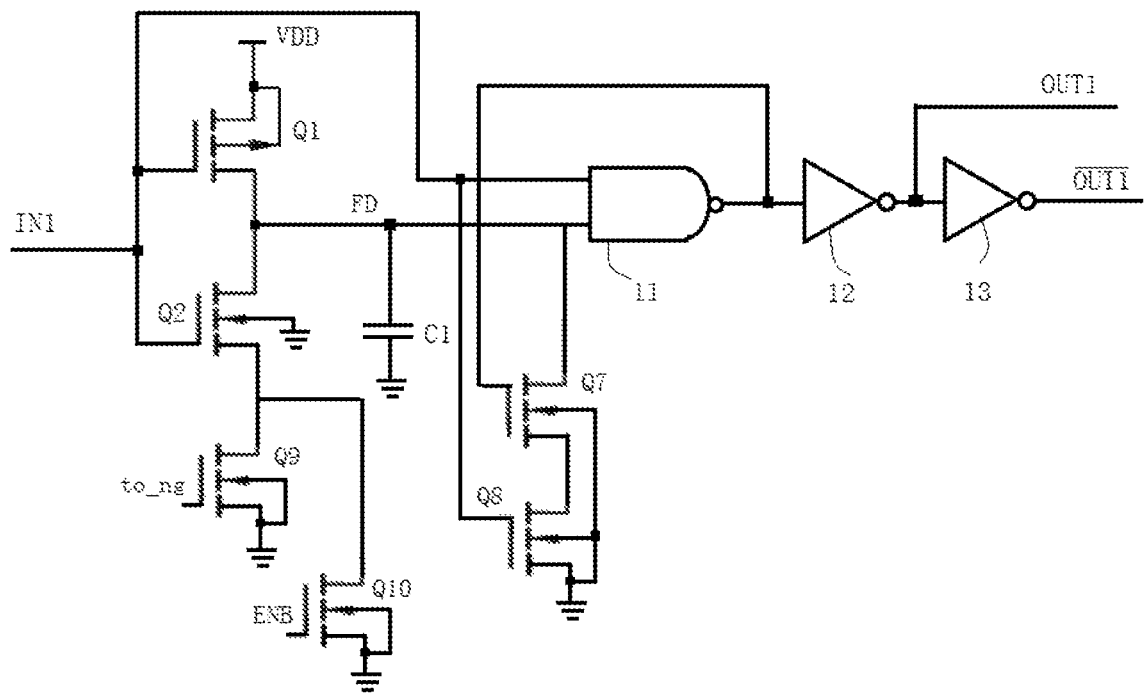
FIG. 6 shows a schematic circuit diagram of an oscillator according to a further embodiment of the present invention.
Figure 7:
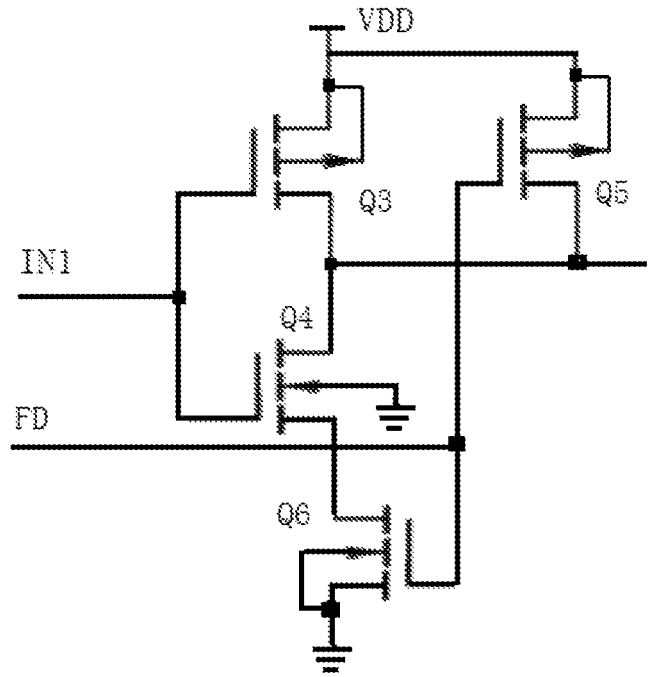
FIG. 7 shows a schematic circuit diagram of a NAND gate circuit in an oscillator according to a further embodiment of the present invention.

Further, as shown in FIGS. 1 and 5, the charge/discharge circuit may include a first resistor R1 and a first capacitor C1. The first resistor R1 is grounded at one end and connected to the source of the second transistor at the other end. The first capacitor C1 is grounded at one end and connected to the drain of the first transistor at the other end (the potential at this point corresponds to the discharge voltage FD). Resistance of the first resistor and capacitance of the first capacitor may be changed to adjust the duty cycle of the oscillator. In another embodiment of the charge/discharge circuit, as shown in FIG. 6, the charge/discharge circuit may include a ninth transistor Q9, a tenth transistor Q10 and a first capacitor C1. The ninth transistor Q9 has a gate connected to a first gate-controlled voltage to_ng, a drain connected to the source of the second transistor Q2 and a source that is grounded. The tenth transistor Q10 has a gate connected to a second gate-controlled voltage ENB, a drain connected to the source of the second transistor Q2 and a source that is grounded. As described above, the first capacitor C1 is grounded at one end and connected to the drain of the first transistor at the other end. The duty cycle of the oscillator can be adjusted by changing the first gate-controlled voltage to_ng. For example, a rise in the first gate-controlled voltage to_ng will result in an increase in the conductance of the ninth transistor. As a result, at the discharge voltage FD, the first capacitor will be discharged at a higher current and the discharge will be completed in a shorter time. This can increase the frequency of the oscillator. Similarly, the frequency of the oscillator will experience a decrease as a result of a decrease in the first gate-controlled voltage to_ng. The second gate-controlled voltage ENB can maintain the tenth transistor Q10 on when the oscillator is not oscillating. As a result, the oscillator will be grounded when it is not oscillating, preventing the discharge voltage FD of the first capacitor C1 from becoming unstable. The second gate-controlled voltage may be directed coupled to the output of the third inverter so as to be an inverted signal of the enable signal EN.

Additionally, in the oscillator, the pulse generation circuit may further include a NAND gate 11 (which is 21 in FIG. 5 for the pulse generation circuit) with two inputs connected respectively to the input signal IN1 and the drain of the first transistor Q1. The pulse generation circuit may further include a first inverter 12 (which is 22 in FIG. 5 for the second pulse generation circuit) and a second inverter 13. The first inverter 12 has an input connected to the output of the NAND gate 11 and outputs the first signal OUT1. The second inverter 13 has an input connected to the output of the first inverter 12 and outputs the second signal $\overline{OUT1}$.

The NAND gate 11 may include a third transistor Q3, a fourth transistor Q4 a fifth transistor Q5 and a sixth transistor Q6. Gates of the third and fourth transistors Q3, Q4 are both connected to the input signal. Gates of the fifth and sixth transistors Q5, Q6 are both connected to the drain of the first transistor Q1. The third and fifth transistors Q3, Q5 are both P-channel field effect transistors and the fourth and sixth transistors Q4, Q6 are both N-channel field effect transistors. Sources of the third and fifth transistors Q3, Q5 are both connected to the power supply and drains of the third and fifth transistors Q3, Q5 are both connected to an output of the NAND gate. A drain of the fourth transistor Q4 is connected to the drain of the third transistor Q3. A source of the fourth transistor Q4 is connected to a drain of the sixth transistor Q6, and a source of the sixth transistor Q6 is grounded. Channel aspect ratios of the third and fifth transistors Q3, Q5 are smaller than channel aspect ratios of the fourth and sixth transistors Q4, Q6. With this arrangement, the NAND gate will more easily switch from the "1" to "0" state but not easily from the "0" to "1" state. As a result, it is possible for the discharge voltage FD to completely drop to zero.

As shown in FIG. 6, the oscillator may further include a seventh transistor Q7 and an eighth transistor Q8. The seventh and eighth transistors Q7, Q8 are both N-channel field effect transistors. The seventh transistor Q7 has a gate connected to the output of the NAND gate 11, a drain connected to the drain of the first transistor Q1 and a source connected to a drain of the eighth transistor Q8. The eighth transistor Q8 has a gate connected to the input signal IN1 and a source that is grounded. When the input signal IN1 is at a high level, the seventh and eighth transistors enable the discharge voltage FD be completely dropped to zero.

As shown in FIGS. 3 and 5, the oscillator comprises two pulse generation circuits which are the first pulse generation circuit 10 and the second pulse generation circuit 20 respectively. The second signal $\overline{OUT1}$ of the first pulse generation circuit 10 can be provided as an input signal to the second pulse generation circuit 20. The oscillator may further include an enable signal input circuit 30. When the enable signal input circuit 30 is provided with an enable signal EN, the enable signal input circuit 30 provides an initial signal to the first pulse generation circuit 10. The enable signal input circuit 30 may include a NOR gate 32 and a third inverter 31. The enable signal EN is supplied to an input of the third inverter 31. The NOR gate 32 has two inputs connected respectively to an output of the third inverter 31 and the output of the first inverter 22 in the second pulse generation circuit 20. That is, the initial signal and the first signal OUT2 of the second pulse generation circuit 20 are both provided as input signals for the NOR gate 32 so that the NOR gate outputs a logic value of EN×$\overline{OUT2}$. An output of the NOR gate 32 is connected to the first pulse generation circuit 10 and thereby provides the input signal IN1=EN×$\overline{OUT2}$ to the first pulse generation circuit 10. The first and second inverter 12, 13 may also be omitted as appropriate for the sake of circuit simplicity.

Figure 4:
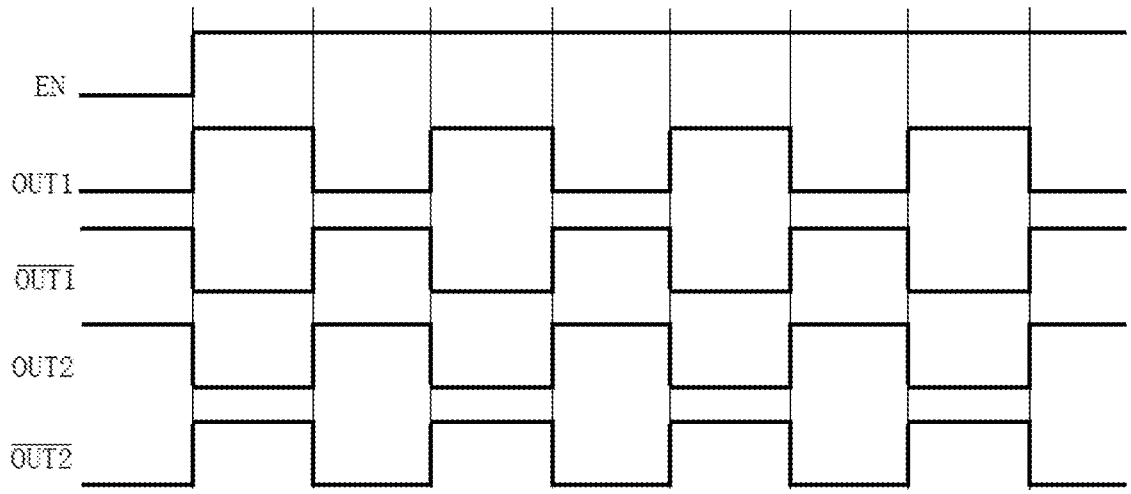
FIG. 4 schematically illustrates waveforms according to another embodiment of the present invention.

As shown in FIG. 4, in the oscillator provided in the present invention, each of the pulse generation circuits outputs a first signal or a second signal depending on an input signal. When the input signal IN1 of the first pulse generation circuit (i.e., pulse generation circuit 10) is at a second level (EN=$\overline{OUT2}$=1), the first signal OUT1 is at the second level and the second signal $\overline{OUT1}$ is at a first level. After the discharge of the charge/discharge circuit is completed, the first signal OUT1 changes to the first level, and the second signal $\overline{OUT1}$ changes to the second level, thereby, the first pulse generation circuit 10 completes one oscillation cycle (and starts to be charged again). With similarity, the second signal $\overline{OUT1}$ is provided to the second pulse generation circuit 20, causing an input signal of the second pulse generation circuit to be at the second level. As a result, the first signal OUT2 of the second pulse generation circuit 20 is at the second level, and the second signal $\overline{OUT2}$ thereof is at the first level. After the discharge of its charge/discharge circuit is completed, the first signal OUT2 changes to the first level, and the second signal $\overline{OUT2}$ changes to the second level, thereby, the second pulse generation circuit 20 completes one oscillation cycle. At this point, since the charge of the first pulse generation circuit 10 has been completed (the charge time is determined by the resistance R1 and capacitance C1) and EN=$\overline{OUT2}$=1, the first pulse generation circuit 10 meets the oscillation condition such that it starts another oscillation cycle. This process is repeated, accomplishing the oscillation of the oscillator.

The charge and discharge of the charge/discharge circuits can delay the oscillation cycle. Based on the adjustment of the charge and discharge times of the charge/discharge circuits, the oscillation frequency can be easily adjusted. Further, the duty cycle of the oscillator is also adjustable by changing the resistance of the first resistor and the capacitance of the first capacitor. For example, increasing the resistance of the first resistor and the capacitance of the first capacitor in the first pulse generation circuit 10 or decreasing the resistance of the first resistor and the capacitance of the first capacitor in the second pulse generation circuit 20 can result in an increase in the duty cycle of OUT1 and a decrease in the duty cycle of OUT2. Furthermore, as the number of gate circuits in the oscillator is reduced, it can be driven by a significantly lower drive current. The oscillator of the present invention can be used in clock circuits, charge pumps and switch capacitors and can also be used to periodically wake up the main controller so that the main controller can rest from time to time to consume less energy.

At last, the first resistor R1 is substituted by a current mirror circuit and a gate voltage of transistors in the current mirror circuit is constant so as to enable the transistors be in a saturation region, thereby, the flowing current is constant. By controlling the gate voltage, the constant current of the current mirror can be adjusted and further to control the charge and discharge times of the first capacitor such that the duty cycle of the oscillator can be changed. The oscillator described herein is a voltage controlled oscillator.

In summary, various configurations of the oscillator have been detailed in the above embodiments. Of course, the present invention includes, but not limited to, the configurations disclosed above, and any and all modifications made to these configurations are considered to fall within the scope of the invention. Those skilled in the art can extend the inventive ideas in many ways.

The description presented above is merely that of some preferred embodiments of the present invention and does not limit the scope thereof in any sense. Any and all changes and modifications made by those of ordinary skill in the art based on the above teachings fall within the scope as defined in the appended claims.

What is claimed is:

1. An oscillator, comprising two pulse generation circuits that are connected in a sequence with an output of a second one of the pulse generation circuits coupled to an input of a first one of the pulse generation circuits, wherein:
    each of the pulse generation circuits outputs a first signal or a second signal depending on an input signal;
    each of the pulse generation circuits comprises a charge/discharge circuit and a switch circuit, the switch circuit configured to control the charge/discharge circuit to be charged when the input signal is at a first level and control the charge/discharge circuit to be discharged when the input signal is at a second level, the first level being lower than the second level;
    when the input signal is at the first level, the first signal is at the first level and the second signal is at the second level;
    when the input signal is at the second level, the first signal is at the second level and the second signal is at the first level, and upon completion of the discharge of the charge/discharge circuit, the first signal changes to the first level and the second signal changes to the second level.

2. The oscillator of claim 1, wherein the switch circuit comprises a first transistor and a second transistor, each of the first and second transistors has a gate supplied with the input signal, the first transistor having a source connected to a power supply, the first transistor having a drain connected to the charge/discharge circuit, the second transistor having a drain connected to the drain of the first transistor, the second transistor having a source connected to the charge/discharge circuit.

3. The oscillator of claim 2, wherein the first transistor is a P-channel field effect transistor and the second transistor is an N-channel field effect transistor.

4. The oscillator of claim 3, wherein the pulse generation circuit further comprises a NAND gate with two inputs of the NAND gate connected respectively to the input signal and the drain of the first transistor.

5. The oscillator of claim 4, wherein the NAND gate comprises a third transistor, a fourth transistor, a fifth transistor and a sixth transistor,
    wherein gates of the third and fourth transistors are both connected to the input signal and gates of the fifth and sixth transistors are both connected to the drain of the first transistor,
    wherein the third and fifth transistors are both P-channel field effect transistors and the fourth and sixth transistors are both N-channel field effect transistors,
    wherein sources of the third and fifth transistors are both connected to the power supply and drains of the third and fifth transistors are both connected to an output of the NAND gate;
    wherein a drain of the fourth transistor is connected to the drain of the third transistor, a source of the fourth transistor is connected to a drain of the sixth transistor, and a source of the sixth transistor is grounded; and
    wherein channel aspect ratios of the third and fifth transistors are smaller than channel aspect ratios of the fourth and sixth transistors.

6. The oscillator of claim 4, further comprising a seventh transistor and an eighth transistor, wherein:
- the seventh and eighth transistors are both N-channel field effect transistors;
- the seventh transistor has a gate connected to an output of the NAND gate, a drain connected to the drain of the first transistor and a source connected to a drain of the eighth transistor; and
- the eighth transistor has a gate connected to the input signal and a source that is grounded.

7. The oscillator of claim 4, wherein each of the pulse generation circuits further comprises a first inverter and a second inverter, the first inverter having an input connected to an output of the NAND gate, the first inverter outputting the first signal, the second inverter having an input connected to an output of the first inverter, the second inverter outputting the second signal.

8. The oscillator of claim 7, wherein the two pulse generation circuits comprise a first pulse generation circuit and a second pulse generation circuit, wherein the second signal of the first pulse generation circuit is provided as the input signal to the second pulse generation circuit.

9. The oscillator of claim 8, further comprising an enable signal input circuit, wherein when the enable signal input circuit is provided with an enable signal, the enable signal input circuit provides an initial signal to the first pulse generation circuit.

10. The oscillator of claim 9, wherein the enable signal input circuit comprises a NOR gate and a third inverter, wherein the enable signal is supplied to an input of the third inverter, wherein the NOR gate has two inputs connected respectively to an output of the third inverter and the output of the first inverter of the second pulse generation circuit, and wherein an output of the NOR gate is connected to the first pulse generation circuit and thereby provides the input signal for the first pulse generation circuit to the first pulse generation circuit.

11. The oscillator of claim 2, wherein the charge/discharge circuit comprises a first resistor and a first capacitor,
- the first resistor grounded at one end and connected to the source of the second transistor at the other end,
- the first capacitor grounded at one end and connected to the drain of the first transistor at the other end.

12. The oscillator of claim 11, having a duty cycle determined by a resistance of the first resistor and a capacitance of the first capacitor.

13. The oscillator of claim 2, wherein the charge/discharge circuit comprises a gate controlled transistor, an additional gate controlled transistor and a first capacitor,
- the gate controlled transistor having a gate connected to a first gate-controlled voltage, a drain connected to the source of the second transistor and a source that is grounded,
- the additional gate controlled transistor having a gate connected to a second gate-controlled voltage, a drain connected to the source of the second transistor and a source that is grounded,
- the first capacitor grounded at one end and connected to the drain of the first transistor at the other end.

14. The oscillator of claim 13, having a duty cycle determined by the first gate-controlled voltage, wherein the second gate-controlled voltage maintains the additional gate controlled transistor on when the oscillator is not oscillating.

* * * * *